United States Patent
Tanaka

(10) Patent No.: US 9,485,894 B2
(45) Date of Patent: Nov. 1, 2016

(54) METAL FOIL FOR ELECTROMAGNETIC SHIELDING, ELECTROMAGNETIC SHIELDING MATERIAL, AND SHIELDING CABLE

(71) Applicant: JX Nippon Mining & Metals Corporation, Tokyo (JP)

(72) Inventor: Koichiro Tanaka, Ibaraki (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 0 days.

(21) Appl. No.: 14/902,188

(22) PCT Filed: Feb. 20, 2014

(86) PCT No.: PCT/JP2014/053976
§ 371 (c)(1),
(2) Date: Dec. 30, 2015

(87) PCT Pub. No.: WO2015/001817
PCT Pub. Date: Jan. 8, 2015

(65) Prior Publication Data
US 2016/0165768 A1    Jun. 9, 2016

(30) Foreign Application Priority Data

Jul. 3, 2013  (JP) ................. 2013-139914

(51) Int. Cl.
*H05K 9/00* (2006.01)
*C25D 5/12* (2006.01)
(Continued)

(52) U.S. Cl.
CPC ............ *H05K 9/0084* (2013.01); *C22C 13/00* (2013.01); *C22C 19/03* (2013.01); *C23C 28/321* (2013.01);
(Continued)

(58) Field of Classification Search
CPC . H05K 9/0084; H05K 9/0086; H05K 9/0098
USPC .................................. 174/388, 257
See application file for complete search history.

(56) References Cited

U.S. PATENT DOCUMENTS

| 6,943,288 B1 * | 9/2005 | Miska ................. H05K 9/0015 174/388 |
| 2002/0038790 A1 * | 4/2002 | Kurii ........................ C23F 1/18 216/13 |
| 2013/0192873 A1 * | 8/2013 | Orikasa .................. H01B 1/026 174/126.2 |

FOREIGN PATENT DOCUMENTS

| JP | 2005-281794 | 10/2005 |
| JP | 2008-274417 | 11/2008 |

(Continued)

OTHER PUBLICATIONS

International Search Report corresponding to International Application No. PCT/JP2014/053976 dated Apr. 1, 2014.

*Primary Examiner* — Timothy Thompson
*Assistant Examiner* — Rhadames J Alonzo Miller
(74) *Attorney, Agent, or Firm* — Jenkins, Wilson, Taylor & Hunt

(57) ABSTRACT

A metal foil for electromagnetic shielding, comprising: a metal foil base, an Sn—Ni alloy layer formed on one or both surfaces of the base, and an oxide layer formed on a surface of the Sn—Ni alloy layer, wherein the Sn—Ni alloy layer includes 20 to 80% by mass of Sn and has a thickness of 30 to 500 nm, and wherein when an analysis in a depth direction is carried out by an XPS being the depth from an outermost surface as X nm, and an atomic percentage (%) of Sn is represented by $A_{Sn}(X)$, an atomic percentage (%) of Ni is represented by $A_{Ni}(X)$, an atomic percentage (%) of oxygen is represented by $A_O(X)$, and X is defined to be $X_O$ when $A_O(X)=0$, 30 nm$=>X_O=>0.5$ nm, and $0.4=>\int A_{Ni}(X)dx/\int A_{Sn}(X)dx=>0.05$ in a section $[0, X_O]$ is satisfied.

20 Claims, 3 Drawing Sheets (a)    (b)

(51) Int. Cl.
*C22C 13/00* (2006.01)
*C22C 19/03* (2006.01)
*C23C 28/00* (2006.01)
*C25D 5/50* (2006.01)
*C25D 7/06* (2006.01)
*C25D 3/12* (2006.01)
*C25D 3/30* (2006.01)
*C25D 3/56* (2006.01)

(52) U.S. Cl.
CPC ............... *C23C 28/345* (2013.01); *C25D 5/12* (2013.01); *C25D 5/505* (2013.01); *C25D 7/0614* (2013.01); *H05K 9/0088* (2013.01); *H05K 9/0098* (2013.01); *B32B 2307/212* (2013.01); *B32B 2307/714* (2013.01); *B32B 2457/00* (2013.01); *C25D 3/12* (2013.01); *C25D 3/30* (2013.01); *C25D 3/562* (2013.01)

(56) References Cited

FOREIGN PATENT DOCUMENTS

| | | |
|---|---|---|
| JP | 2013-007092 | 1/2013 |
| WO | WO 2009/144973 | 12/2009 |
| WO | WO 2011/040280 | 4/2011 |

\* cited by examiner (a)      (b)

METAL FOIL FOR ELECTROMAGNETIC SHIELDING, ELECTROMAGNETIC SHIELDING MATERIAL, AND SHIELDING CABLE

FIELD OF THE INVENTION

The present invention relates to a metal foil used for an electromagnetic shielding material by laminating a resin layer or a resin film, an electromagnetic shielding material and a shielding cable using the same.

DESCRIPTION OF THE RELATED ART

An Sn plated film has characteristics of excellent corrosion resistance, good solderability, and low contact resistance. Accordingly, the Sn plated film, which is provided by plating Sn on a metal, e.g., copper, foil, is used as a composite material for an electromagnetic shielding material of a vehicle.

The composite material has a structure having a base of copper or a copper alloy foil, a resin layer or film laminated on one surface of the base, and an Sn plated film formed on the other surface thereof (see Patent Literature 1).

Also, a multilayer plating aluminum (alloy) foil has been developed by forming a zincate treated layer, a nickel electroplated layer, or a Tin electroplated layer on a surface of aluminum or an aluminum alloy foil, thereby improving moisture resistance and corrosion resistance (see Patent Literature 2).

PRIOR ART DOCUMENTS

Patent Literatures

[Patent Literature 1] PCT Patent Publication WO 2009/144973

[Patent Literature 2] Japanese Unexamined Patent Publication (Kokai) 2013-007092

SUMMARY OF THE INVENTION

Problems to be Solved by the Invention

An electromagnetic shielding material of a vehicle requires corrosion resistance to NOx, SOx included in exhaust gas of a vehicle and corrosion resistance to salt water. The Sn plating is soft. So, even if the surface of the Sn plating is corroded and a chloride or an oxide is formed, the chloride or the like is easily scraped and new pure Sn appears on the surface, once the Sn plating is in contact with a mating material. Therefore, the Sn plating has excellent corrosion resistance, and can maintain low contact resistance even under corrosion atmosphere.

However, Sn easily forms a diffusion layer. If Sn is used for a long period of time, all Sn in the Sn plating forms an alloy, pure Sn do not remain, and the corrosion resistance is lowered. Accordingly, in order to provide the corrosion resistance for a long period of time, it is necessary to increase the thickness of the Sn plating, which leads to increased costs.

The present invention is made to solve the above-mentioned problems. An object of the present invention is to provide a metal foil for electromagnetic shielding, an electromagnetic shielding material and a shielding cable having excellent corrosion resistance with low costs.

Means for Solving the Problem

Through diligent studies, the present inventors have successfully found that a metal foil for electromagnetic shielding having excellent corrosion resistance with low costs by forming an Sn—Ni alloy layer on a surface of a metal foil, and forming an oxide layer including Sn and Ni on a surface of the Sn—Ni alloy layer.

To achieve the above object, the present invention provides a metal foil for electromagnetic shielding, comprising: a metal foil base, an Sn—Ni alloy layer formed on one or both surfaces of the base, and an oxide layer formed on a surface of the Sn—Ni alloy layer, wherein the Sn—Ni alloy layer includes 20 to 80% by mass of Sn and has a thickness of 30 to 500 nm, and wherein when an analysis in a depth direction is carried out by an XPS being the depth from an outermost surface as X nm, and an atomic percentage (%) of Sn is represented by $A_{Sn}(X)$, an atomic percentage (%) of Ni is represented by $A_{Ni}(X)$, an atomic percentage (%) of oxygen is represented by $A_O(X)$, and X is defined to be $X_O$ when $A_O(X)=0$, 30 nm=>$X_O$=>0.5 nm, and $0.4 => \int A_{Ni}(X)dx / \int A_{Sn}(X)dx => 0.05$ in a section $[0, X_O]$ is satisfied.

Preferably, the Sn—Ni alloy layer further includes one or more elements selected from the group consisting of P, W, Fe and Co.

Preferably, the Sn—Ni alloy layer includes 10% by mass of an element configuring the base.

Preferably, the metal foil for electromagnetic shielding further comprising: an underlayer composed of a Ni metal layer or an alloy layer of Ni and P, W, Fe, Co or Zn formed between the Sn—Ni alloy layer and the base.

Preferably, the base is composed of gold, silver, platinum, stainless steel, iron, nickel, zinc, copper, a copper alloy, aluminum or an aluminum alloy.

Preferably, the base is aluminum or the aluminum alloy, and wherein a Zn layer is formed between the base and the underlayer.

The present invention provides an electromagnetic shielding material, comprising the metal foil for electromagnetic shielding, and a resin layer laminated on one surface of the metal foil.

Preferably, the resin layer is a resin film.

The present invention provides a shielding cable shielded by the electromagnetic shielding material.

Effects of the Invention

According to the present invention, there is provided a metal foil for electromagnetic shielding having excellent corrosion resistance with low costs.

DESCRIPTION OF THE EMBODIMENTS

Figure 1:
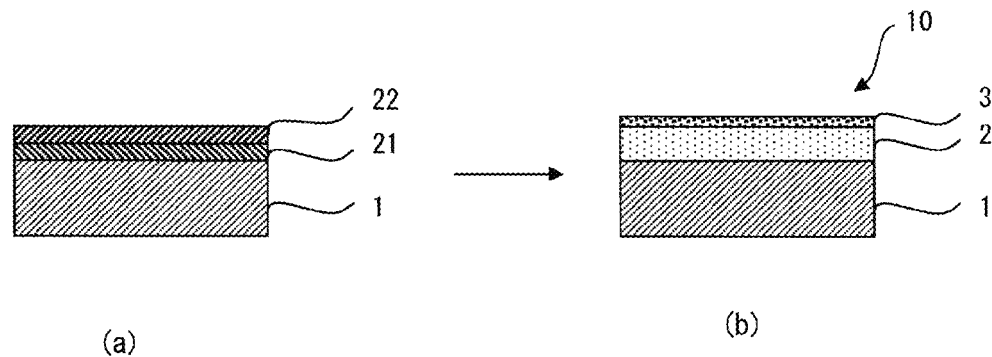
FIG. 1 A cross-sectional view showing a metal foil for electromagnetic shielding according to an embodiment of the present invention.

As shown in FIG. 1(b), a metal foil for electromagnetic shielding 10 according to an embodiment of the present invention includes a metal foil base 1, and an Sn—Ni alloy layer 2 formed on one surface of the base 1. On a surface of the Sn—Ni alloy layer 2, an oxide layer 3 is formed. The oxide layer 3 is generally laminar. If the oxide layer 3 is thin, the oxide layer 3 may not be a perfect layer.

(Base)

The base 1 may be any metal having high conductivity providing electromagnetic shielding effects. Examples of the base 1 include a foil of gold, silver, platinum, stainless steel, iron, nickel, zinc, copper, a copper alloy, aluminum or an aluminum alloy. In general, the base 1 is a copper or aluminum foil.

A method of forming the base 1 is not especially limited. For example, the base 1 may be formed by rolling or electroplating a foil. Alternatively, the base 1 may be film-formed by dry plating on a surface of a resin layer or a resin film of an electromagnetic shielding material as described later.

The thickness of the base 1 may be determined taking a frequency to be intended by an electromagnetic shielding and a skin effect. Specifically, it is preferable to have a skin depth or more provided by substituting the following equation (1) for conductivity of an element configuring the base 1 and the intended frequency. For example, if a copper foil is used as the base 1 and the intended frequency is 100 MHz, the skin depth is 6.61 μm. The base 1 preferably has a thickness of about 7 μm or more. If the base 1 is thicker, flexibility and workability become poor and raw material costs increase. Therefore, the thickness of the base 1 is set to 100 μm or less. The thickness is preferably 4 to 50 μm, more preferably 5 to 25 μm.

$$d = \{2/(2\pi \times f \times \sigma \times \mu)\}^{1/2} \quad (1)$$

d: skin depth (μm)
f: frequency (GHz)
σ: conductivity of conductor (S/m)
μ: magnetic permeability (H/m)

If the copper foil is used as the base 1, a type of the copper foil is not especially limited. Typically, a rolled copper foil or an electrolytic copper foil may be used. In general, the electrolytic copper foil is produced by electrolytic depositing copper on a titanium or stainless steel drum from a sulfate copper plating bath or a cyanide copper plating bath. The rolled copper foil is produced by repeating plastic working and thermal treatment by a rolling mill roll.

As the rolled copper foil, oxygen free copper (JIS-H3100 (C1020)) or tough pitch copper (JIS-H3100 (C1100)) having a purity of 99.9% or more may be used. As the copper alloy foil, known copper alloys may be used depending on necessary strength and conductivity. Known copper alloys may be a copper alloy including 0.01 to 0.3% of tin or a copper alloy including 0.01 to 0.05% of silver, for example. In particular, Cu-0.12% Sn or Cu-0.02% Ag is often used because of excellent conductivity. For example, the rolled copper foil having conductivity of 5% or more may be used. Known electrolytic copper foils may be used.

The aluminum foil having a purity of 99.0% or more may be used. As the aluminum alloy foil, known aluminum alloys may be used depending on necessary strength and conductivity. For example, known aluminum alloys may be an aluminum alloy including 0.01 to 0.15% of Si and 0.01 to 1.0% of Fe, and an aluminum alloy including 1.0 to 1.5% of Mn.

(Si—Ni Alloy Layer)

The Sn—Ni alloy layer 2 includes 20 to 80% by mass of Sn. The Sn—Ni alloy layer 2 has high corrosion resistance to NOx and SOx as compared with other Sn alloy (for example, a Sn—Cu alloy), and is relatively inexpensive.

If a percentage of Sn in the Sn—Ni alloy layer is less than 20% by mass, the corrosion resistance of the alloy layer is lowered. On the other hand, if the percentage of Sn in the Sn—Ni alloy layer exceeds 80% by mass, a formation of an oxide layer excessively proceeds on the surface of the alloy layer by heating, the oxide layer easily becomes thick, and a percentage of Ni in the oxide layer easily increases.

Preferably, the Sn—Ni alloy layer 2 is an intermetallic compound of $Ni_3Sn$, $Ni_3Sn_2$ or $Ni_3Sn_4$. The intermetallic compound has excellent corrosion resistance as compared with a non-equilibrium alloy layer.

The thickness of the Sn—Ni alloy layer is preferably 30 to 500 nm, more preferably 50 to 300 nm, more preferably 75 to 150 nm. If the thickness of the Sn—Ni alloy layer is less than 30 nm, the corrosion resistance to salt water, NOx, SOx gases is insufficient. On the other hand, if the thickness of the Sn—Ni alloy layer exceeding 500 nm becomes too thick, and stiffness of the Sn—Ni alloy layer becomes high, resulting in crack generation, lowered corrosion resistance, and increased costs.

The thicknesses of the Sn—Ni alloy layer and the underlayer are determined by carrying out a line analysis using a STEM (scanning transmission electron microscope) for a cross-sectional sample of the metal foil for electromagnetic shielding. Specified elements to be analyzed are Sn, Ni, P, W, Fe, Co, Zn, C, S, O and elements included in the base. Percentages (wt %) of respective elements in the respective layers are analyzed (accelerating voltage: 200 kV, measurement distance: 2 nm) by setting a total of the above-described specified elements as 100%.

Figure 4:
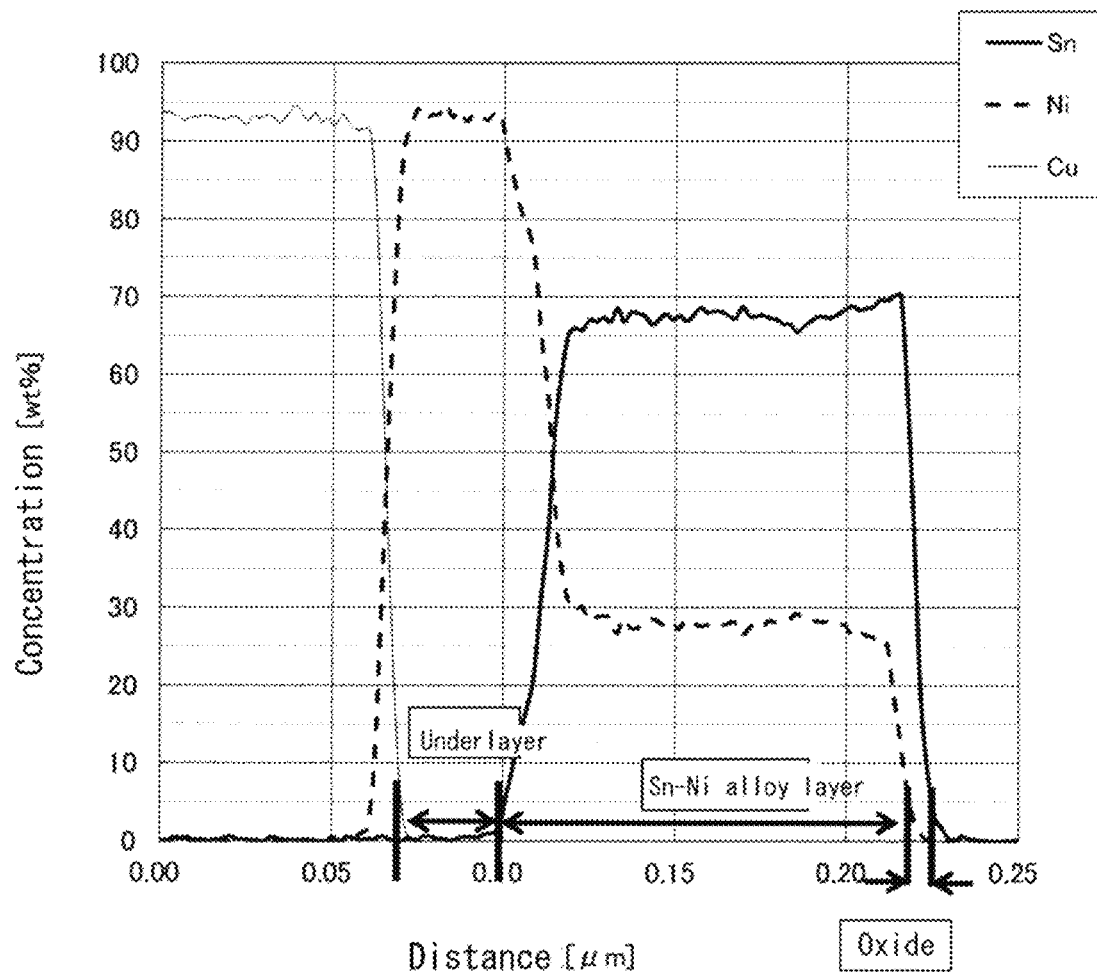
FIG. 4 A graph showing a line analysis result of a sample in Example 1 by a STEM.

As shown in FIG. 4, the Sn—Ni alloy layer includes 5 wt % or more of Sn and 5 wt % of Ni. The thickness thereof is determined from FIG. 4 (corresponding to a scanning distance of the line analysis). The underlayer is positioned lower than the Sn alloy layer, and includes less than 5 wt % of Sn and 5 wt % or more of Ni. The thickness thereof is determined from FIG. 4.

The STEM measurement is carried out in three field of view. The thickness of each layer is obtained from an average value of multiply five points in each field of view by 3.

If the Sn—Ni alloy layer 2 further includes one or more elements (referred to as a "C element group") selected from the group consisting of P, W, Fe and Co, the corrosion resistance of the Sn—Ni alloy layer is preferably improved. A total percentage of the C element group in the Sn—Ni alloy layer is preferably 1 to 40% by mass, more preferably 5 to 30% by mass.

Note that the C element group may be included in the Sn—Ni alloy layer itself when the Sn—Ni alloy layer is formed. Instead, the C element group may be included in the underlayer, the Sn—Ni alloy layer including no C element group may formed, and the C element group may be diffused into the Sn—Ni alloy layer by a thermal treatment as desired. Alternatively, the C element group may be included in the underlayer, and the Sn—Ni alloy layer including no C element group may formed as it is. In this case, the C element group is diffused in the Sn—Ni alloy layer, when the metal foil for electromagnetic shielding is used at high temperature.

(Oxide Layer)

On the surface of the Sn—Ni alloy layer 2, the oxide layer 3 is formed. The oxide layer has high corrosion resistance to NOx and SOx as compared with the Sn—Ni alloy layer 2, thereby improving the corrosion resistance.

If the oxide layer becomes too thick, initial contact resistance of the metal foil for electromagnetic shielding increases. Note that the oxide layer is not necessarily laminar. Therefore, the thickness of the oxide layer is defined as follows.

Figure 5:
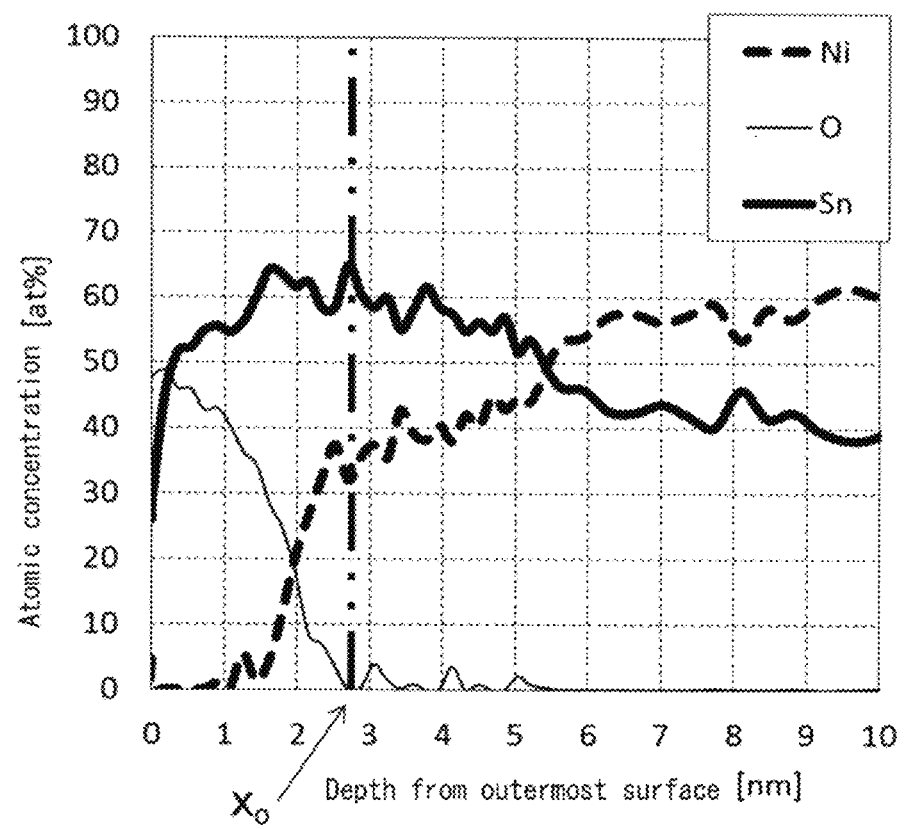
FIG. 5 A graph showing an analysis result of a sample in Example 1 by XPS.

In other words, as shown in FIG. 5, an analysis in a depth direction is carried out by an XPS (X-ray Photoelectron Spectroscopy) being the depth from an outermost surface as X nm. An atomic percentage (%) of Sn is represented by $A_{Sn}$ (X), an atomic percentage (%) of Ni is represented by $A_{Ni}$ (X), an atomic percentage (%) of oxygen is represented by $A_O$ (X). When $A_O$ (X)=0, X is defined to be $X_O$. $X_O$ is a depth when the oxygen concentration becomes 0 from the outermost surface to the depth direction, and therefore represents the thickness of the oxide layer. If 30 nm=>$X_O$=>0.5 nm, the thickness of the oxide layer is appropriate. If $X_O$<0.5 nm, the oxide layer becomes thin, thereby decreasing the corrosion resistance, as described above. On the other hand, if $X_O$>30 nm, the initial contact resistance increases.

The oxide layer includes Sn and Ni. If the percentage of Ni becomes too high to Sn in the oxide layer, the percentage of Ni having high contact resistance increases, and the contact resistance of the metal foil for electromagnetic shielding also increases. If the percentage of Ni becomes too low to Sn in the oxide layer, the corrosion resistance decreases.

From the XPS in FIG. 5, in a section [0, $X_0$], $\int A_{Ni}(X)dx / \int A_{Sn}(X)dx$ is determined. The value is the atomic percentage of Ni to Sn in the oxide layer (hereinafter referred to "Ni ratio"). If 0.4=>$\int A_{Ni}(X)dx/\int A_{Sn}(X)dx$=>0.05, the percentage of Ni to Sn in the oxide layer is appropriate. If the Ni ratio is less than 0.05, the corrosion resistance decreases. If the Ni ratio exceeds 0.4, the contact resistance increases.

$\int A_{Ni}(X)dx$ is an area between $A_{Ni}(X)$ (a curve represented by a broken line in FIG. 5) and a horizontal axis in the section [0, $X_0$], and is in proportion to the amount of Ni in the oxide layer. Similarly, $\int A_{Sn}(X)dx$ is an area between $A_{Sn}(X)$ (a curve represented by a thick line in FIG. 5) and the horizontal axis in the section [0, $X_0$], and is in proportion to the amount of Sn in the oxide layer.

The underlayer is preferably formed between the base 1 and the Sn—Ni alloy layer. The underlayer prevents the components of the base 1 from diffusing to the Sn—Ni alloy layer 2, thereby further improving the corrosion resistance of the alloy layer. The underlayer includes 50% by mass or more of Ni.

(Method of Forming Sn—Ni Alloy Layer)

The Sn—Ni alloy layer may be formed by alloy plating (wet plating), sputtering an alloy target configuring the alloy layer, vapor deposition using the components configuring the alloy layer or the like.

Alternatively, as shown in FIG. 1(a), a first layer 21 including Ni is firstly formed on one surface of the base 1, a second layer 31 including Sn is formed on the surface of the first layer 21, the first layer 21 and the second layer 31 are thermally treated to alloy the elements of the first layer 21 and the second layer 3, thereby forming the Sn—Ni alloy layer 2 shown in FIG. 1(b), for example. In this case, the thickness of each layer may be controlled so that the first layer 21 remains as an Ni underlayer after the thermal treatment. The conditions of the thermal treatment are not especially limited. For example, the thermal treatment may be carried out at 120 to 500° C. for about two seconds to ten hours.

Also, the underlayer and the Sn—Ni alloy layer 2 may be formed by vapor deposition, PVD, CVD or the like other than wet plating.

Furthermore, if aluminum or an aluminum alloy foil is used as the base, a zinc-substitution plating layer may be formed between the underlayer and the base 1 as undercoating for plating Ni on the underlayer.

(Method of Forming Oxide Layer of Sn and Ni)

If the Sn—Ni alloy layer is provided by the thermal treatment shown in FIG. 1(a), the oxide layer may be formed at the same time by the thermal treatment. Note that if the oxygen concentration within the thermal treatment atmosphere exceeds 2%, the oxide layer excessively grows and $X_0$ may be >30 nm. On the other hand, if the oxygen concentration within the thermal treatment atmosphere is less than 0.1%, the oxide layer is insufficiently formed and $X_0$ may be <0.5 nm. Therefore, the oxygen concentration within a thermal treatment atmosphere is preferably 0.1 to 2% or less. The temperature and the time for the thermal treatment are not especially limited, but may be 80 to 230° C. for about 1 to 15 hours. If a heating temperature exceeds 230° C., Sn melts and forms a liquid phase. Thus, alloying proceeds rapidly, and the oxide layer is insufficiently formed. $X_0$ may be less than 0.5 nm. In addition, if the heating temperature exceeds 230° C., the temperature becomes high after the Sn—Ni alloy layer is formed. As a result, oxidation of Ni proceeds, and the Ni ratio in the oxide layer may exceed 0.4.

If the Sn—Ni alloy layer is formed by alloy plating (wet plating), sputtering an alloy target configuring the alloy layer, vapor deposition using the components configuring the alloy layer or the like, the oxide layer may be formed by carrying out the thermal treatment under the above-described atmosphere, temperature, and time after the Sn—Ni alloy layer is formed.

Figure 2:
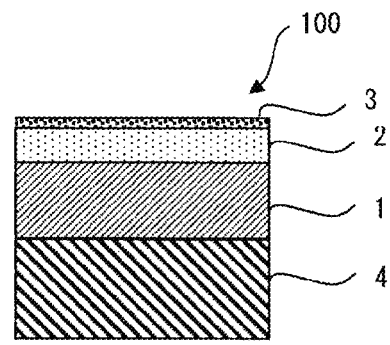
FIG. 2 A cross-sectional view showing an electromagnetic shielding material according to the present invention.

Next, referring to FIG. 2, an electromagnetic shielding material 100 according to embodiments of the present invention will be described. The electromagnetic shielding material 100 is configured of a metal foil for electromagnetic shielding 10 and a resin layer or a resin film 4 laminated on one surface of the metal foil 10.

As the resin layer, resin such as polyimide may be used, for example. As the resin film, a film of PET (polyethylene terephthalate) or PEN (polyethylene naphthalate) may be used, for example. The resin layer and the resin film may be adhered to the metal foil with an adhesive, casted on the metal foil using molten resin with no adhesive, or thermo-compression bonding a film to the metal foil. Alternatively, there may be used a film including a resin film and a copper or aluminum layer directly formed as a base thereon by PVD or CVD. Furthermore, there may be used a metallized film including a resin film, a thin copper or aluminum layer formed on the resin film by PVD or CVD as a conductive layer, and a thick metal layer formed on the conductive layer by wet plating.

Known resin layers or resin films may be used. The thickness of the resin layer or the resin film is not especially limited, but may be preferably 1 to 100 μm, more preferably 3 to 50 μm. Furthermore, if the adhesive is used, the thickness of the adhesive layer may be 10 μm or less, for example.

From a standpoint of the lighter and thinner material, the thickness of the electromagnetic shielding material 100 is preferably 1.0 mm or less, more preferably 0.01 to 0.5 mm.

By winding the electromagnetic shielding material 100 around a cable, a shielding cable is provided.

EXAMPLES

Next, the present invention will be further described in detail by illustrating the following examples, but is not limited thereto.
(Base)

As the rolled copper foil, a rolled copper foil (model C1100 manufactured by JX Nippon Mining & Metals) having a thickness of 8 µm was used.

As the electrolytic copper foil, non-roughened electrolytic copper foil (model JTC foil manufactured by JX Nippon Mining & Metals) having a thickness of 8 µm was used.

As the Cu metallized film, metallizing CCL (product name "MAQUINAS" manufactured by Nippon Mining & Metals) having a thickness of 8 µm was used.

As the aluminum foil, an aluminum foil (manufactured by Sun Aluminum Industries Co., Ltd.) having a thickness of 12 µm was used.

As the Al metallized film, a PET film (manufactured by TOYOBO Co., Ltd.) having a thickness of 12 µm on which aluminum having a thickness of 6 µm was vapor deposited was used.
(Formation of Each Layer)

The underlayer and the Sn—Ni alloy layer were formed on one surface of the base. Table 1 and Table 2 show a method of forming each layer. The compositions and the thicknesses of the underlayer, the Sn—Ni alloy layer and the oxide layer are the final values after the following thermal treatment.

In Table 1 and Table 2, "plating" means that the first layer (Ni layer) 21 and the second layer (Sn layer) 31 are plated by the method shown in FIG. 1(*a*) in this order, and are thermally treated under the conditions shown in Table 1 and Table 2. All thermal treatment was carried out under a nitrogen atmosphere. The oxygen concentration in a thermal treatment furnace was shown in Table 1 and Table 2. In Table 1 and Table 2, "alloy plating" means that the Sn—Ni alloy layer is formed by alloy plating.

In Examples 17 to 20, the Ni alloy plating having the composition (the composition where the C element group is added to Ni) shown in Table 1 and Table 2 was applied to the first layer 21 in place of the Ni layer. When the Sn—Ni alloy layer was formed by the thermal treatment, the Ni alloy plating layer remained on the lower layer of the Sn—Ni alloy layer as the underlayer. In addition, upon the thermal treatment, elements other than Ni (P, W, Fe, Co) were also diffused from the underlayer, thereby forming the Sn—Ni alloy layer including the three components.

In Examples 13 and 14, a Zn layer was formed on an aluminum base by substitution plating, a Ni underlayer and Sn plating were sequentially applied to the Zn layer, and the Sn—Ni alloy layer was formed by the thermal treatment.

In Comparative Example 8, a Zn layer was formed on an aluminum foil by substitution plating, a Ni underlayer was plated on the Zn layer, and Sn was plated on the underlayer, but no thermal treatment was carried out.

Each plating was formed by the following conditions:
Ni plating: a nickel sulfate bath (Ni concentration: 20 g/L, current density: 2 to 10 A/dm$^2$)
Sn plating: a tin-phenolsulfonate bath (Sn concentration: 40 g/L, current density: 2 to 10 A/dm$^2$)
Zn-substitution plating: a zincate bath (Zn concentration: 15 g/L)
Ni—Sn: a pyrophosphate bath (Ni concentration 10 g/L, Sn concentration 10 g/L, current density: 0.1 to 2 A/dm$^2$)
Ni—P: a sulfate bath (Ni concentration: 20 g/L, P concentration: 20 g/L, current density: 2 to 4 A/dm2)
Ni—W: a sulfate bath (Ni concentration: 20 g/L, P concentration: 20 g/L, current density: 0.1 to 2 A/dm$^2$)
Ni—Fe: a sulfate bath (Ni concentration: 20 g/L, Fe concentration: 10 g/L, current density: 0.1 to 2 A/dm$^2$)
Ni—Co: a sulfate bath (Ni concentration: 20 g/L, Co concentration: 10 g/L, current density: 0.1 to 2 A/dm$^2$)

In Table 1 and Table 2, "sputtering" means that Ni and Sn are sputtered in this order and then thermally treated.

In Table 1 and Table 2, "alloy sputtering" means that Ni is sputtered to form the underlayer, and a Sn—Ni alloy target material is then used and sputtered to form the Sn—Ni alloy layer.

The layer formed by the alloy sputtering had a composition of the alloy itself. In order to form the oxide layer, the thermal treatment was carried out.

The sputtering and the alloy sputtering were carried out under the following conditions:
Sputtering apparatus: a batch type sputtering apparatus (ULVAC Inc., model MNS-6000)
Sputtering conditions: ultimate vacuum 1.0×10$^{-5}$ Pa, sputtering pressure 0.2 Pa, sputtering power 50 W
Target: Ni (purity 3N), Sn (purity 3N), Ni—Sn (Ni: Sn=85:15, 75:25, 60:40, 27:73, 15:85 (% by mass))
(Measurement of Identification and Thickness of Sn—Ni Alloy Layer and Underlayer)

The resultant cross-sectional sample of the metal foil for electromagnetic shielding was subjected to a line analysis using a STEM (scanning transmission electron microscope, JEM-2100F manufactured by JOEL Ltd.) to determine a layer structure. The specified elements analyzed are Sn, Ni, C element groups (P, W, Fe, Co), Zn, C, S, O and elements included in the base. By defining the total of the above-described designated elements as 100%, a percentage (wt %) of each element in each layer was analyzed (accelerating voltage: 200 kV, measurement distance: 2 nm).

As shown in FIG. 4, the layer including 5 wt % or more of Sn and 5 wt % or more of Ni was the Sn—Ni alloy layer, and the thickness thereof was determined from FIG. 4 (corresponding to a scanning distance of the line analysis). The layer positioned lower than the Sn alloy layer, and including less than 5 wt % of Sn and 5 wt % or more of Ni was the underlayer, and the thickness thereof is determined from FIG. 4. The STEM measurement was carried out in three field of view. The thickness of each layer was an average value of multiply five points in each field of view by 3.
(Measurement of Thickness $X_O$ of Oxide Layer and Ni Ratio)

A surface of the resultant cross-sectional sample of the metal foil for electromagnetic shielding was scraped by an ion beam using an XPS (5600MC manufactured by ULVAC PHI Inc.), and atomic concentrations of Sn, Ni and O (oxygen) were analyzed (accelerating voltage: 3 kV, sputtering rate: 1.8 nm/min). From an XPS chart shown in FIG. 5, the thickness $X_O$ of the oxide layer and the Ni ratio were determined by the above-described method.
(Evaluation of Contact Resistance and Corrosion Resistance)

For a surface of the Sn—Ni alloy layer of the resultant metal foil for electromagnetic shielding, contact resistance of the outermost surface of the Sn—Ni alloy layer before and after a gas corrosion test was measured.

The contact resistance was measured by a four terminal method using an electric contact simulator CRS-1 manufactured by Yamazaki Seiki Co., Ltd. Probe: gold probe, contact load: 20 gf, bias current: 10 mA, a slide distance: 1 mm.

The gas corrosion test was carried out according to IEC60512-11-7 test method 4 (temperature: 25° C., humidity: 75%, $H_2S$ concentration: 10 ppb, $NO_2$ concentration: 200 ppb, $Cl_2$ concentration: 10 ppb, $SO_2$ concentration: 200 ppb, test time: seven days).

The contact resistance was evaluated by the following criteria:
Excellent: the contact resistance was less than 10 mΩ
Good: the contact resistance was from 10 mΩ or more to less than 100 mΩ
Not good: the contact resistance was 100 mΩ or more Note that the contact resistance before the gas corrosion test represents an initial contact resistance, and the contact resistance after the gas corrosion test represents corrosion resistance. If the evaluations of the contact resistance before and after the gas corrosion test were both good, there is no problem in practical use.

In each of Examples and Comparative Examples, an adhesion weight of Sn, Ni, P, W, Fe, Co or Cu per 1 m² was calculated from the thickness and the composition of each layer. The cost of the sample was estimated from a metal price. The cost lower than the predetermined threshold value was evaluated as good, and the cost exceeding the same was evaluated as not good.

The results are shown in Table 1 and Table 2

TABLE 1

| | | | Sn—Ni alloy layer | | | | | |
| | | | | | Percentage of each component (wt %) | | Oxide | | Method of |
| | Base | Composition of underlayer | Composition | Thickness (nm) | Sn | C element group | X0 (nm) | Ni ratio | forming each layer |
|---|---|---|---|---|---|---|---|---|---|
| Example 1 | Rolled copper foil | Ni | SnNi | 125 | 73 | 0 | 2.7 | 0.2 | Plating |
| Example 2 | Rolled copper foil | Ni | SnNi | 125 | 40 | 0 | 1 | 0.3 | Alloy sputtering |
| Example 3 | Rolled copper foil | Ni | SnNi | 125 | 25 | 0 | 1 | 0.36 | Alloy sputtering |
| Example 4 | Rolled copper foil | Ni | SnNi | 30 | 73 | 0 | 2.7 | 0.15 | Plating |
| Example 5 | Rolled copper foil | Ni | SnNi | 480 | 73 | 0 | 2.5 | 0.2 | Plating |
| Example 6 | Rolled copper foil | None | SnNi | 125 | 73 | 0 | 1 | 0.2 | Alloy sputtering |
| Example 7 | Rolled copper foil | Ni | SnNi | 125 | 73 | 0 | 28 | 0.2 | Plating |
| Example 8 | Rolled copper foil | Ni | SnNi | 125 | 73 | 0 | 1.5 | 0.15 | Plating |
| Example 9 | Rolled copper foil | Ni | SnNi | 125 | 73 | 0 | 5 | 0.25 | Plating |
| Example 10 | Rolled copper foil | Ni | SnNi | 125 | 80 | 0 | 1 | 0.07 | Alloy sputtering |
| Example 11 | Electrolytic copper foil | Ni | SnNi | 125 | 73 | 0 | 2.5 | 0.2 | Plating |
| Example 12 | Metallized Cu | Ni | SnNi | 125 | 73 | 0 | 2.6 | 0.2 | Plating |
| Example 13 | Al foil | Ni | SnNi | 125 | 73 | 0 | 2.5 | 0.2 | Plating |
| Example 14 | Metallized Al | Ni | SnNi | 125 | 73 | 0 | 2.7 | 0.2 | Plating |
| Example 15 | Rolled copper foil | Ni | SnNi | 125 | 73 | 0 | 0.5 | 0.2 | Alloy plating |
| Example 16 | Rolled copper foil | Ni | SnNi | 125 | 73 | 0 | 2.5 | 0.2 | Sputtering |
| Example 17 | Rolled copper foil | NiP | SnNiP | 125 | 71 | 3 | 2.4 | 0.2 | Plating |
| Example 18 | Rolled copper foil | NiW | SnNiW | 125 | 62 | 15 | 2.5 | 0.2 | Plating |
| Example 19 | Rolled copper foil | NiFe | SnNiFe | 125 | 69 | 5 | 2.7 | 0.2 | Plating |
| Example 20 | Rolled copper foil | NiCo | SnNiCo | 125 | 70 | 4 | 2.5 | 0.2 | Plating |

| | | | | Contact resistance | | | | |
| | | | | Before gas corrosion test | | After gas corrosion test | | |
| | Thermal treatment conditions | | | | | | | |
| | Oxygen concentration (%) | Temperature (° C.) | Time | Contact resistance (mΩ) | Evaluation | Contact resistance (mΩ) | Evaluation | Cost |
|---|---|---|---|---|---|---|---|---|
| Example 1 | 0.5 | 180 | 5 h | 5 | Excellent | 13 | Excellent | Good |
| Example 2 | 0.5 | 120 | 1 h | 2 | Excellent | 32 | Good | Good |
| Example 3 | 0.5 | 120 | 1 h | 14 | Good | 22 | Excellent | Good |
| Example 4 | 0.5 | 180 | 5 h | 3 | Excellent | 23 | Good | Good |
| Example 5 | 0.5 | 180 | 5 h | 5 | Excellent | 15 | Excellent | Good |
| Example 6 | 0.5 | 120 | 1 h | 3 | Excellent | 39 | Good | Good |
| Example 7 | 1.8 | 180 | 5 h | 18 | Good | 24 | Excellent | Good |
| Example 8 | 0.5 | 200 | 5 s | 2 | Excellent | 14 | Good | Good |
| Example 9 | 0.5 | 100 | 12 h | 22 | Good | 28 | Excellent | Good |
| Example 10 | 0.5 | 120 | 1 h | 2 | Excellent | 37 | Good | Good |
| Example 11 | 0.5 | 180 | 5 h | 8 | Excellent | 17 | Excellent | Good |
| Example 12 | 0.5 | 180 | 5 h | 7 | Excellent | 16 | Excellent | Good |
| Example 13 | 0.5 | 180 | 5 h | 1 | Excellent | 12 | Excellent | Good |
| Example 14 | 0.5 | 180 | 5 h | 3 | Excellent | 16 | Excellent | Good |
| Example 15 | 0.5 | 120 | 1 h | 2 | Excellent | 38 | Good | Good |
| Example 16 | 0.5 | 180 | 5 h | 8 | Excellent | 35 | Good | Good |
| Example 17 | 0.5 | 180 | 5 h | 4 | Excellent | 22 | Good | Good |
| Example 18 | 0.5 | 180 | 5 h | 7 | Excellent | 29 | Good | Good |
| Example 19 | 0.5 | 180 | 5 h | 11 | Excellent | 21 | Good | Good |
| Example 20 | 0.5 | 180 | 5 h | 6 | Excellent | 25 | Good | Good |

TABLE 2

| | Base | Composition of underlayer | Sn—Ni alloy layer Composition | Thickness (nm) | Percentage of each component (wt %) Sn | C element group | Oxide X0 (nm) | Ni ratio | Method of forming each layer |
|---|---|---|---|---|---|---|---|---|---|
| Comparative Example 1 | Rolled copper foil | Ni | SnNi | 125 | 73 | 0 | 35 | 0.2 | Plating |
| Comparative Example 2 | Rolled copper foil | Ni | SnNi | 125 | 73 | 0 | 0.2 | 0.2 | Plating |
| Comparative Example 3 | Rolled copper foil | Ni | SnNi | 125 | 85 | 0 | 1 | 0.03 | Alloy sputtering |
| Comparative Example 4 | Rolled copper foil | Ni | SnNi | 125 | 15 | 0 | 1 | 0.44 | Alloy sputtering |
| Comparative Example 5 | Rolled copper foil | Ni | SnNi | 18 | 73 | 0 | 2.5 | 0.2 | Plating |
| Comparative Example 6 | Rolled copper foil | Ni | SnNi | 600 | 73 | 0 | 2.5 | 0.2 | Plating |
| Comparative Example 7 | Rolled copper foil | — | SnCu | 125 | 61 | 0 | — | — | Plating |
| Comparative Example 8 | Al foil | Ni | Sn | 1000 | 100 | 0 | — | — | Plating |
| Comparative Example 9 | Rolled copper foil | Ni | SnNi | 125 | 73 | 0 | 0.2 | 0.58 | Plating |
| Comparative Example 10 | Rolled copper foil | None | Sn | 1000 | 100 | 0 | — | — | Plating |

| | Thermal treatment conditions Oxygen concentration (%) | Temperature (° C.) | Time | Contact resistance Before gas corrosion test Contact resistance (mΩ) | Evaluation | After gas corrosion test Contact resistance (mΩ) | Evaluation | Cost |
|---|---|---|---|---|---|---|---|---|
| Comparative Example 1 | 5 | 180 | 5 h | 136 | Not good | 181 | Not good | Good |
| Comparative Example 2 | 0.05 | 180 | 5 h | 3 | Excellent | 2000 or more | Not good | Good |
| Comparative Example 3 | 0.5 | 120 | 1 h | 2 | Excellent | 2000 or more | Not good | Good |
| Comparative Example 4 | 0.5 | 120 | 1 h | 122 | Not good | 2000 or more | Not good | Good |
| Comparative Example 5 | 0.5 | 180 | 5 h | 28 | Good | 2000 or more | Not good | Good |
| Comparative Example 6 | 0.5 | 180 | 5 h | 3 | Excellent | 2000 or more | Not good | Not good |
| Comparative Example 7 | 0.5 | 180 | 5 h | 127 | Not good | 2000 or more | Not good | Good |
| Comparative Example 8 | None | | | 2 | Excellent | 18 | Good | Not good |
| Comparative Example 9 | 0.5 | 320 | 30 s | 187 | Not good | 223 | Not good | Good |
| Comparative Example 10 | None | | | 2 | Excellent | 16 | Good | Not good |

As apparent from Table 1 and Table 2, in each Example having the Sn—Ni alloy layer and the oxide layer on the surface of the base, the initial contact resistance was low, and the corrosion resistance was excellent even after the gas corrosion test.

Figure 3:
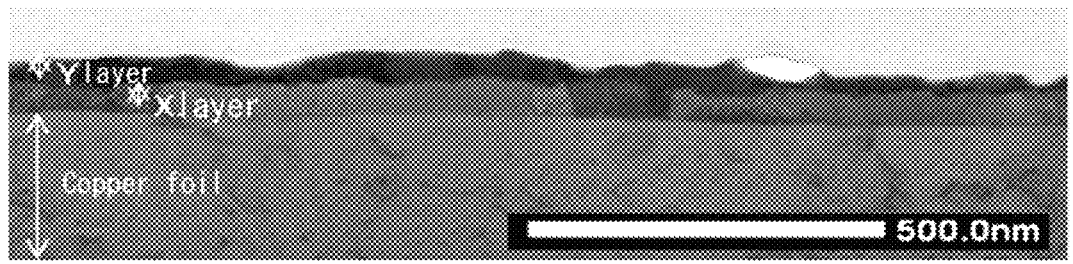
FIG. 3 A view showing a cross-sectional image of a sample in Example 1 by a STEM.

FIG. 3 and FIG. 4 are a cross-sectional image and a line analysis result of the sample in Example 1 by the STEM, respectively. The line analysis result reveals that X and Y layers in the cross-sectional image are the Sn—Ni alloy layer and the Ni layer, respectively.

FIG. 5 is an analysis result by XPS of the sample in Example 1.

On the other hand, in Comparative Example 1 where the thermal treatment was carried out under atmosphere having the oxygen concentration of exceeding 2%, $X_O$ exceeded 30 nm and the oxide layer becomes thick, thereby increasing the initial contact resistance.

In Comparative Example 2 where the thermal treatment was carried out under atmosphere having the oxygen concentration of less than 0.1%, $X_O$ was less than 0.5 nm and the oxide layer becomes thin, thereby decreasing the corrosion resistance.

In Comparative Example 3 where the Sn concentration of the Sn—Ni alloy exceeded 80% by mass, the Ni ratio in the oxide layer was less than 0.05, thereby decreasing the corrosion resistance.

In Comparative Example 4 where the Sn concentration of the Sn—Ni alloy was less than 20% by mass, the Ni ratio in the oxide layer exceeded 0.4, thereby increasing the initial contact resistance.

In Comparative Example 5 where the thickness of the Sn—Ni alloy layer was less than 30 nm, the corrosion resistance was poor.

In Comparative Example 6 where the thickness of the Sn—Ni alloy layer exceeded 500 nm, cracks were generated on the surface, the corrosion resistance was decreased, and the costs were increased.

In Comparative Example 7 where the Sn—Cu alloy was formed in place of the Sn—Ni alloy, the corrosion resistance was poor.

In Comparative Examples 8 and 10 where a pure Sn layer was formed in place of the Sn—Ni alloy, the costs were increased.

In Comparative Example 9 where the temperature of the thermal treatment exceeded 230° C., alloying proceeded at the temperature above the melting point of Sn, and the Ni ratio in the oxide layer exceeded 0.4, thereby increasing the initial contact resistance.

DESCRIPTION OF REFERENCE NUMERALS 1 metal foil
2 Sn—Ni alloy layer
3 oxide layer
4 resin layer or resin film
10 metal foil for electromagnetic shielding
100 electromagnetic shielding material

What is claimed is:

1. A metal foil for electromagnetic shielding, comprising:
a metal foil base, an Sn—Ni alloy layer formed on one or both surfaces of the base, and an oxide layer formed on a surface of the Sn—Ni alloy layer, wherein
the Sn—Ni alloy layer includes 20 to 80% by mass of Sn and has a thickness of 30 to 500 nm, and wherein
when an analysis in a depth direction is carried out by XPS with the depth from an outermost surface as X nm, and an atomic percentage (%) of Sn is represented by $A_{Sn}(X)$, an atomic percentage (%) of Ni is represented by $A_{Ni}(X)$, an atomic percentage (%) of oxygen is represented by $A_O(X)$, and X is defined to be $X_O$ when $A_O(X)=0$, $30 \text{ nm} \geq X_O \geq 0.5 \text{ nm}$, and $0.4 \geq \int A_{Ni}(X)dx / \int A_{Sn}(X)dx \geq 0.05$ in a section $[0, X_O]$ is satisfied.

2. The metal foil for electromagnetic shielding according to claim 1, wherein the Sn—Ni alloy layer further includes one or more elements selected from the group consisting of P, W, Fe and Co.

3. The metal foil for electromagnetic shielding according to claim 1, wherein the Sn—Ni alloy layer includes 10% by mass of an element configuring the base.

4. The metal foil for electromagnetic shielding according to claim 1, further comprising:
an underlayer composed of a Ni metal layer or an alloy layer of Ni and P, W, Fe, Co or Zn formed between the Sn—Ni alloy layer and the base.

5. The metal foil for electromagnetic shielding according to claim 1, wherein the base is composed of gold, silver, platinum, stainless steel, iron, nickel, zinc, copper, a copper alloy, aluminum or an aluminum alloy.

6. The metal foil for electromagnetic shielding according to claim 1, wherein the base is aluminum or an aluminum alloy, and wherein a Zn layer is formed between the base and an underlayer.

7. An electromagnetic shielding material, comprising the metal foil for electromagnetic shielding according to claim 1, and a resin layer laminated on one surface of the metal foil.

8. The electromagnetic shielding material according to claim 7, wherein the resin layer is a resin film.

9. A shielding cable shielded by the electromagnetic shielding material according to claim 7.

10. A shielding cable shielded by the electromagnetic shielding material according to claim 8.

11. The metal foil for electromagnetic shielding according to claim 2, wherein the Sn—Ni alloy layer includes 10% by mass of an element configuring the base.

12. The metal foil for electromagnetic shielding according to claim 2, further comprising:
an underlayer composed of a Ni metal layer or an alloy layer of Ni and P, W, Fe, Co or Zn formed between the Sn—Ni alloy layer and the base.

13. The metal foil for electromagnetic shielding according to claim 3, further comprising:
an underlayer composed of a Ni metal layer or an alloy layer of Ni and P, W, Fe, Co or Zn formed between the Sn—Ni alloy layer and the base.

14. The metal foil for electromagnetic shielding according to claim 2, wherein the base is composed of gold, silver, platinum, stainless steel, iron, nickel, zinc, copper, a copper alloy, aluminum or an aluminum alloy.

15. The metal foil for electromagnetic shielding according to claim 3, wherein the base is composed of gold, silver, platinum, stainless steel, iron, nickel, zinc, copper, a copper alloy, aluminum or an aluminum alloy.

16. The metal foil for electromagnetic shielding according to claim 4, wherein the base is composed of gold, silver, platinum, stainless steel, iron, nickel, zinc, copper, a copper alloy, aluminum or an aluminum alloy.

17. The metal foil for electromagnetic shielding according to claim 2, wherein the base is aluminum or an aluminum alloy, and wherein a Zn layer is formed between the base and an underlayer.

18. The metal foil for electromagnetic shielding according to claim 3, wherein the base is aluminum or an aluminum alloy, and wherein a Zn layer is formed between the base and an underlayer.

19. The metal foil for electromagnetic shielding according to claim 4, wherein the base is aluminum or an aluminum alloy, and wherein a Zn layer is formed between the base and the underlayer.

20. The metal foil for electromagnetic shielding according to claim 5, wherein the base is aluminum or an aluminum alloy, and wherein a Zn layer is formed between the base and an underlayer.

* * * * *